(12) United States Patent
Park et al.

(10) Patent No.: US 7,737,719 B2
(45) Date of Patent: Jun. 15, 2010

(54) APPARATUS FOR ADJUSTING RESISTANCE VALUE OF A DRIVER IN A SEMICONDUCTOR INTEGRATED CIRCUIT

(75) Inventors: Jae Boum Park, Ichon (KR); Young Bo Shim, Ichon (KR)

(73) Assignee: Hynix Semiconductor Inc. (KR)

( * ) Notice: Subject to any disclaimer, the term of this patent is extended or adjusted under 35 U.S.C. 154(b) by 39 days.

(21) Appl. No.: 12/025,502

(22) Filed: Feb. 4, 2008

(65) Prior Publication Data
US 2009/0002019 A1 Jan. 1, 2009

(30) Foreign Application Priority Data
Jun. 26, 2007 (KR) ...................... 10-2007-0063068

(51) Int. Cl.
H03K 17/16 (2006.01)
H03K 19/003 (2006.01)
H03K 5/12 (2006.01)
(52) U.S. Cl. ...................... 326/30; 327/170; 365/189.11
(58) Field of Classification Search .................. 326/30, 326/68, 86, 87, 112, 115, 126, 127; 327/108, 327/109, 170, 172–176; 365/189.05, 189.11
See application file for complete search history.

(56) References Cited
U.S. PATENT DOCUMENTS
5,787,045 A 7/1998 Lee
6,215,837 B1 4/2001 Yi
6,307,424 B1 * 10/2001 Lee .............................. 327/530
6,912,169 B2 6/2005 Choi
7,224,625 B2 5/2007 Dietrich et al.
7,521,957 B2 * 4/2009 Koo ............................. 326/30
2007/0285293 A1 * 12/2007 Lee .............................. 341/144
2008/0253201 A1 * 10/2008 Lee ........................ 365/189.07
2009/0009213 A1 * 1/2009 Osanai et al. .................. 326/30

FOREIGN PATENT DOCUMENTS
JP 2003-163591 6/2003
KR 1020040079119 9/2004
KR 1007180501 B1 5/2007
KR 1020070088845 8/2007

* cited by examiner

Primary Examiner—Vibol Tan
Assistant Examiner—Dylan White
(74) Attorney, Agent, or Firm—Baker & McKenzie LLP

(57) ABSTRACT

An apparatus for adjusting a resistance value of a driver of a semiconductor integrated circuit in which the resistance value of the driver is adjusted according to a code signal. The apparatus includes a control means that generates a plurality of counting mode signals such that the unit of counting is changed in a predetermined period, a counting means that counts the code signal in the unit of counting that is changed in response to the plurality of counting mode signals, according to a count up/down signal, and a comparing means that compares a voltage obtained by converting the code signal with a reference voltage to generate the count up/down signal.

20 Claims, 7 Drawing Sheets

APPARATUS FOR ADJUSTING RESISTANCE VALUE OF A DRIVER IN A SEMICONDUCTOR INTEGRATED CIRCUIT

CROSS-REFERENCE TO RELATED PATENT APPLICATION

This application claims priority under 35 U.S.C. 119(a) to Korean Patent Application No. 10-2007-0063068, filed on Jun. 26, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit, and more particularly, to an apparatus for adjusting the resistance value of a driver in a semiconductor integrated circuit.

2. Related Art

In conventional semiconductor integrated circuits, the resistance value of a data output driver should be stably maintained at a target value in order to properly output data. A periodic adjusting process is needed to maintain the resistance value of the driver at a constant value regardless of an external environment, such as voltage or temperature.

A conventional process of adjusting the resistance value of the driver uses an external resistor RZQ that is connected to the semiconductor integrated circuit through a pin (hereinafter, referred as a ZQ pin) in order to set up an exact standard.

The process of adjusting the resistance value of the driver using the external resistor RZQ is performed as follows: A digital-to-analog converting circuit connected to the external resistor RZQ converts a predetermined code value into an analog voltage, and the analog voltage is compared with a reference voltage. The digital-to-analog converting circuit and the driver are similarly modeled. The predetermined code value is changed according to the result of the comparison and the comparing process is repeated until the analog voltage is equal to the reference voltage. When the analog voltage is equal to the reference voltage, the code value is input to the driver to adjust the resistance value of the driver.

A conventional semiconductor integrated circuit has a fixed adjustable range of the resistance value according to a variation in the code value, that is, a fixed resolution in adjusting the resistance value of the driver. As shown in FIG. 1, a conventional semiconductor integrated circuit increases or decreases the resistance value at the fixed resolution according to the result obtained by the comparing process to change the voltage, and compares the changed voltage with the reference voltage, thereby adjusting the resistance value of the driver.

Since the resolution is fixed during the process of adjusting the resistance value of the driver, it takes a lot of time to adjust the resistance value and the adjustable range of the resistance value is limited.

SUMMARY

An apparatus for adjusting the resistance value of a driver of a semiconductor integrated circuit that is capable of quick adjustment, and is capable of widening an adjustable range of the resistance value.

According to one aspect, there is provided an apparatus for adjusting a resistance value of a driver of a semiconductor integrated circuit in which the resistance value of the driver is adjusted according to a code signal. The apparatus includes a control means that generates a plurality of counting mode signals such that the unit of counting is changed in a predetermined period, a counting means that counts the code signal in the unit of counting that is changed in response to the plurality of counting mode signals, according to a count up/down signal, and a comparing means that compares a voltage obtained by converting the code signal with a reference voltage to generate the count up/down signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
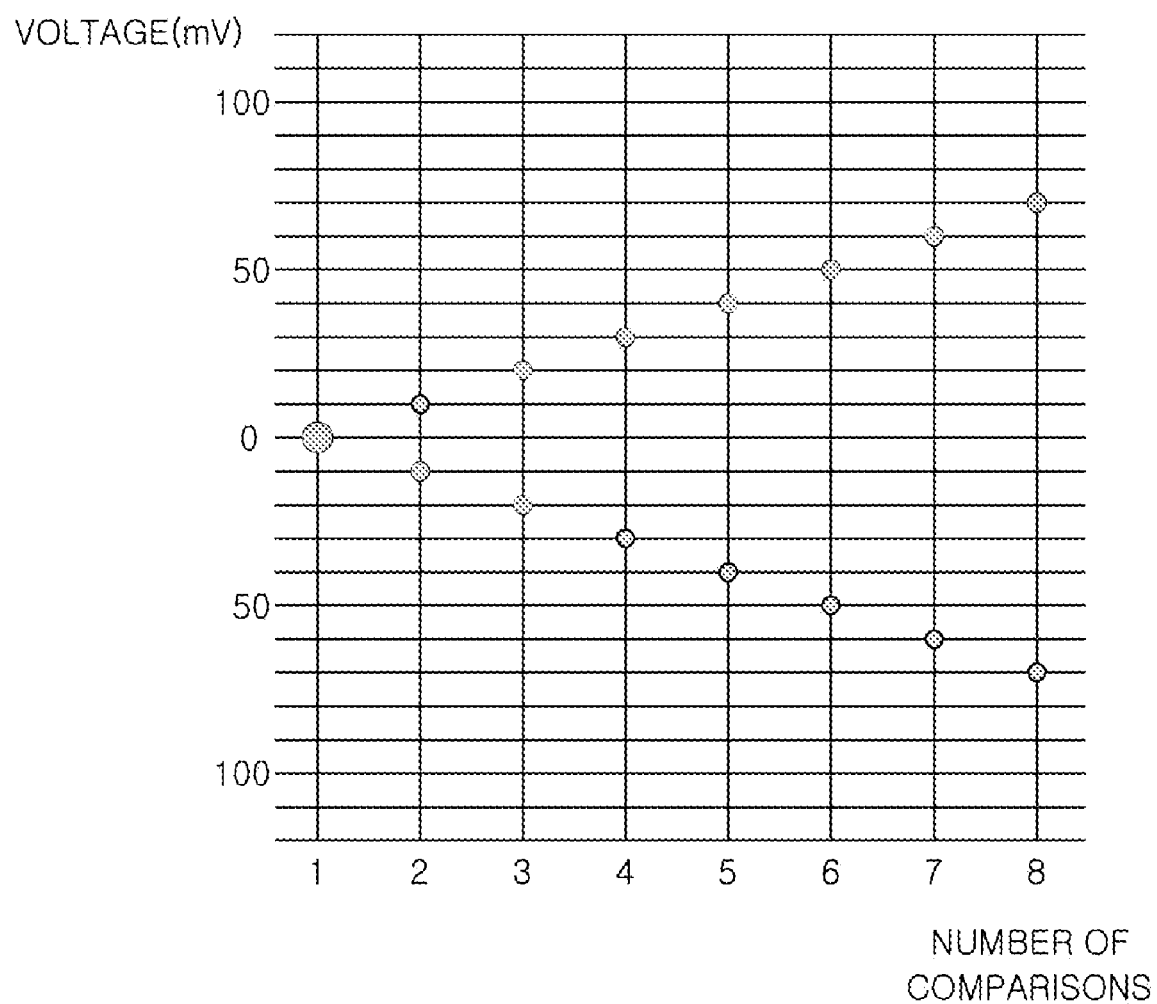
FIG. 1 is a graph illustrating an exemplary method of adjusting the resistance value of a driver of a semiconductor integrated circuit.
Figure 2:
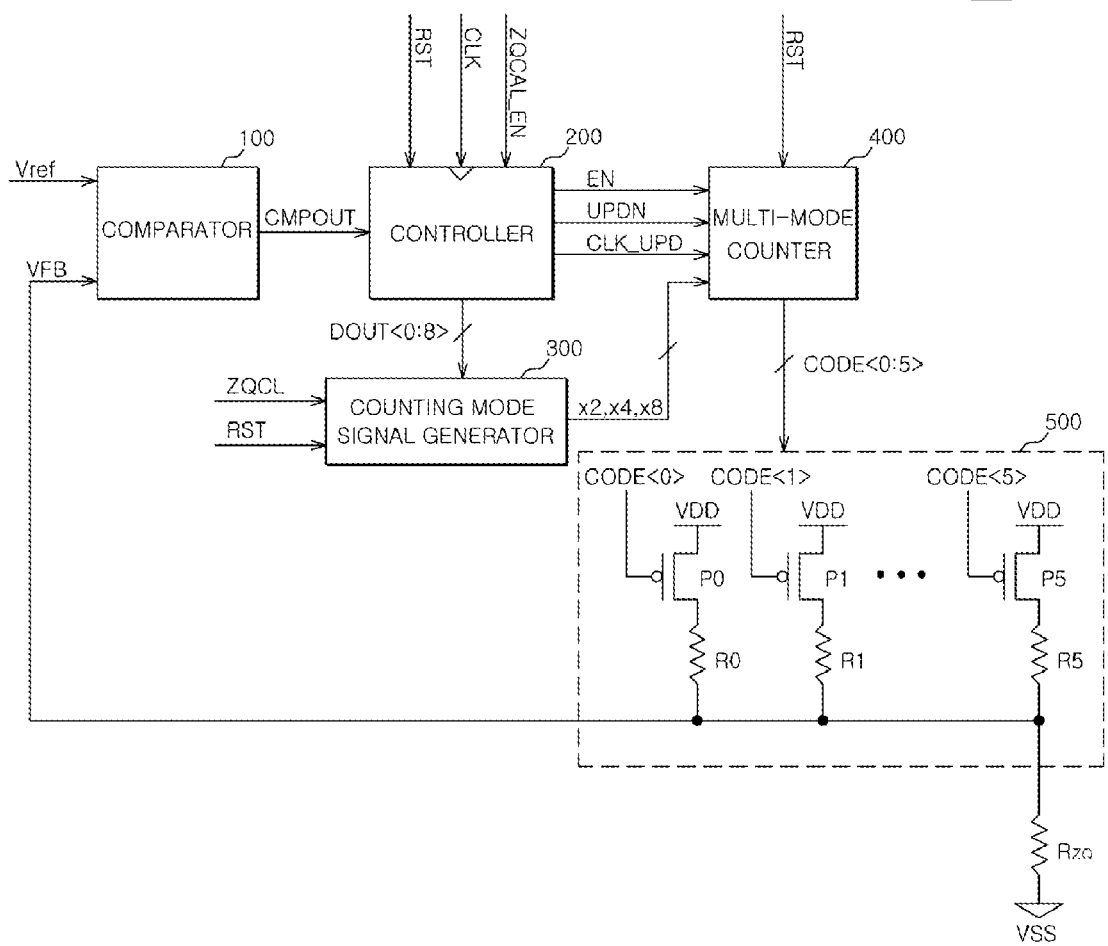
FIG. 2 is a block diagram illustrating an apparatus for adjusting the resistance value of a driver of a semiconductor integrated circuit according to one embodiment.

FIG. 2 is a diagram illustrating an example apparatus 101 for adjusting the resistance value of a driver in a semiconductor integrated circuit in accordance with one embodiment. As shown in FIG. 2, the apparatus 101 can include a comparator 100, a controller 200, a counting mode signal generator 300, a multi-mode counter 400, and a digital-to-analog converter 500.

The comparator 100 can be configured to receive a reference voltage VREF and an analog feedback voltage VFB, and output a comparison result signal 'CMPOUT'. The comparator 100 can be composed of a differential amplifier.

The controller 200 can be configured to receive an adjustment enable signal 'ZQCAL_EN', a clock signal 'CLK', a reset signal 'RST', and the comparison result signal 'CMPOUT', and output a first count signal 'DOUT<0:8>', a basic counting signal 'EN', a count up/down signal 'UPDN', and an update clock signal 'CLK_UPD'.

The counting mode signal generator 300 can be configured to receive an adjustment start signal 'ZQCL', a reset signal 'RST', and the counting signal 'DOUT<0:8>', and output a first counting mode signal 'X8', a second counting mode signal 'X4', and a third counting mode signal 'X2'.

The multi-mode counter 400 can be configured to receive the basic counting signal 'EN', the count up/down signal 'UPDN', the update clock signal 'CLK_UPD' the first to third counting mode signals 'X8', 'X4', and 'X2', and the reset signal 'RST', and output a code signal 'CODE<0:5>'.

The digital-to-analog converter 500 can be configured to output an analog feedback voltage VFB obtained by dividing an external voltage VDD by a resistance value that is determined according to the code signal 'CODE<0:5>'. The digital-to-analog converter 500 is similarly modeled with a data output driver. The digital-to-analog converter 500 can include a plurality of transistors P0 to P5, each having a source supplied with the external voltage VDD and a gate to which a bit of the code signal 'CODE<0:5>' is input, and a plurality of resistors R0 to R5 respectively connected to the plurality of transistors P0 to P5. The plurality of resistors R0 to R5 can be connected to a common external resistor RZQ through ZQ pins.

Figure 3:
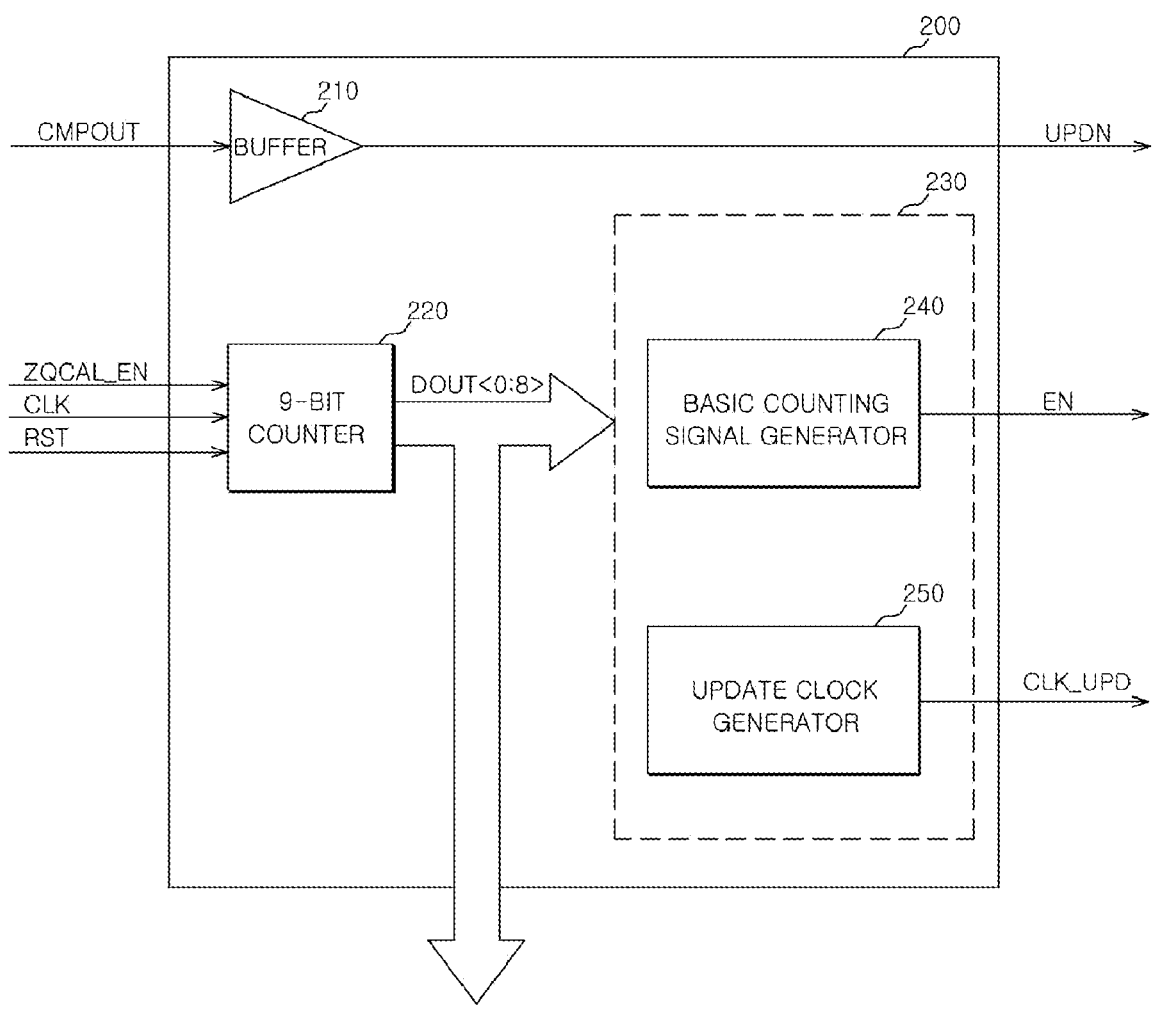
FIG. 3 is a block diagram illustrating the structure of a controller that can be included in the apparatus shown in FIG. 2.

As shown in FIG. 3, the controller 200 can include a buffer 210, a 9-bit counter 220, and a control logic circuit unit 230. The buffer 210 can be configured to buffer the comparison result signal 'CMPOUT' and output it as the count up/down signal 'UPDN'. The 9-bit counter 220 can be configured to count the clock signal 'CLK' according to the adjustment enable signal 'ZQCAL_EN' and output a counting signal 'DOUT<0:8>'.

The control logic circuit unit 230 can include a counting signal generator 240 that can be configured to generate the basic counting signal 'EN' using the counting signal 'DOUT<0:8>' and an update clock generator 250 that can be configured to generate the update clock signal 'CLK_UPD' using the counting signal 'DOUT<0:8>'.

Figure 4:
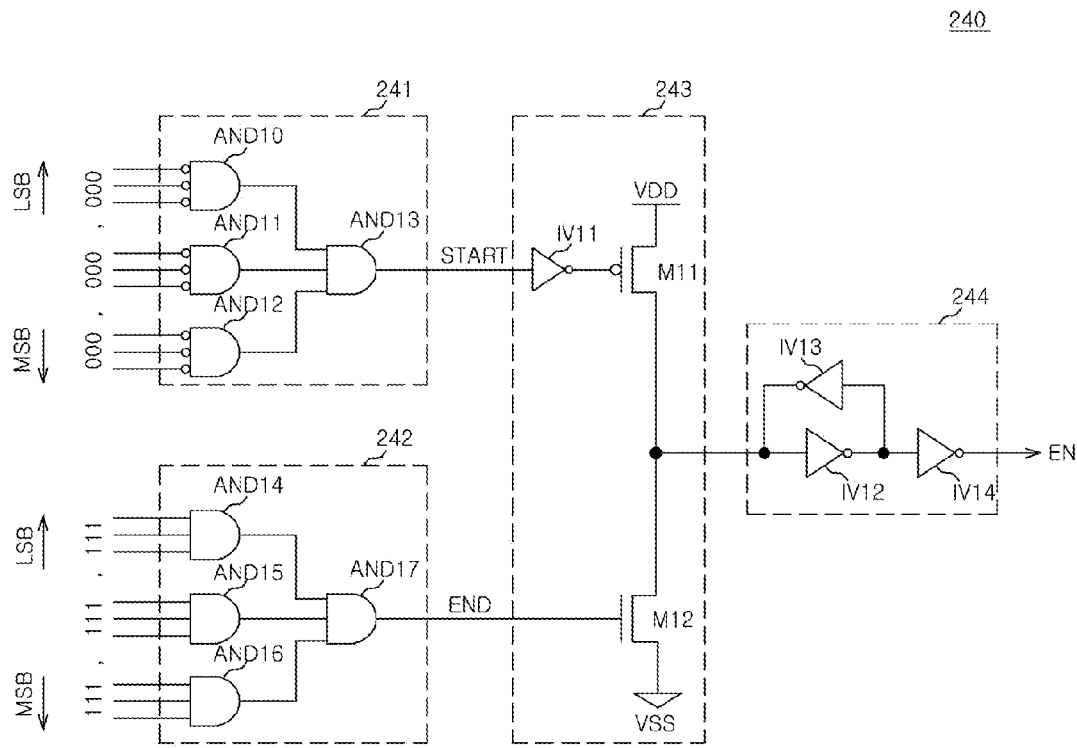
FIG. 4 is a circuit diagram illustrating a basic counting signal generator that can be included in the controller shown in FIG. 3.

As shown in FIG. 4, the basic counting signal generator 240 can be configured to maintain the basic counting signal 'EN' in an active state for a predetermined time required to adjust the resistance value (for example, 512 clocks) using the counting signal 'DOUT<0:8>'. The basic counting signal generator 240 can include an activation start determining unit 241, an activation end determining unit 242, a signal driving unit 243, and a latch unit 244.

The activation start determining unit 241 can be configured to determine to start activating the basic counting signal 'EN' when the counting signal 'DOUT<0:8>' has a first logic value.

The activation start determining unit 241 can include first to third AND gates AND10 to AND12 to which the bits of the counting signal 'DOUT<0:8>' are input, and a fourth AND gate AND13 that can be configured to receive output signals of the first to third AND gates AND10 to AND12 and output an activation start signal 'START'.

The activation end determining unit 242 can be configured to end the activation of the basic counting signal 'EN' when the counting signal 'DOUT<0:8>' has a second logic value. The activation end determining unit 242 can include fifth to seventh AND gates AND14 to AND16 to which the bits of the counting signal 'DOUT<0:8>' are input, and an eighth AND gate AND17 that can be configured to receive output signals of the fifth to seventh AND gates AND14 to AND16 and output an activation end signal 'END'.

The signal driving unit 243 can be configured to drive the activation start signal 'START' and the activation end signal 'END' and output the signals. The signal driving units 243 can include a first inverter IV11 and first and second transistors M11 and M12. The first inverter IV11 can be configured to receive the activation start signal 'START'. The first and second transistors M11 and M12 can have gates to which an output signal of the first inverter IV11 and the activation end signal 'END' are input respectively. The signal driving unit 243 can have an output terminal that is connected to a node between the first transistor M11 and the second transistor M12.

The latch unit 244 can be configured to latch the output of the signal driving unit 243 and output the signal as the basic counting signal 'EN'. The latch unit 244 can include second to fourth inverters IV12 to IV14.

Figure 5:
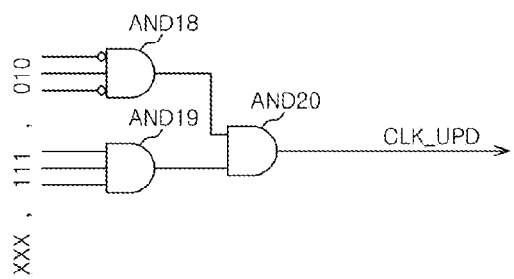
FIG. 5 is a circuit diagram illustrating an update clock generator that can be included in the controller shown in FIG. 3.

As shown in FIG. 5, the update clock generator 250 can be configured to determine when the time (512 clocks) required to adjust the resistance value ends on the basis of the counting signal 'DOUT<0:8>', and deactivate the basic counting signal 'EN' on the basis of the result of the determination. The update clock generator 250 can include first and second AND gates AND18 and AND19 that can be configured to receive the counting signals 'DOUT<0:8>' and a third AND gate AND20 that can be configured to receive output signals of the first and second AND gates AND18 and AND19 and output the update clock signal 'CLK_UPD'.

Figure 6:
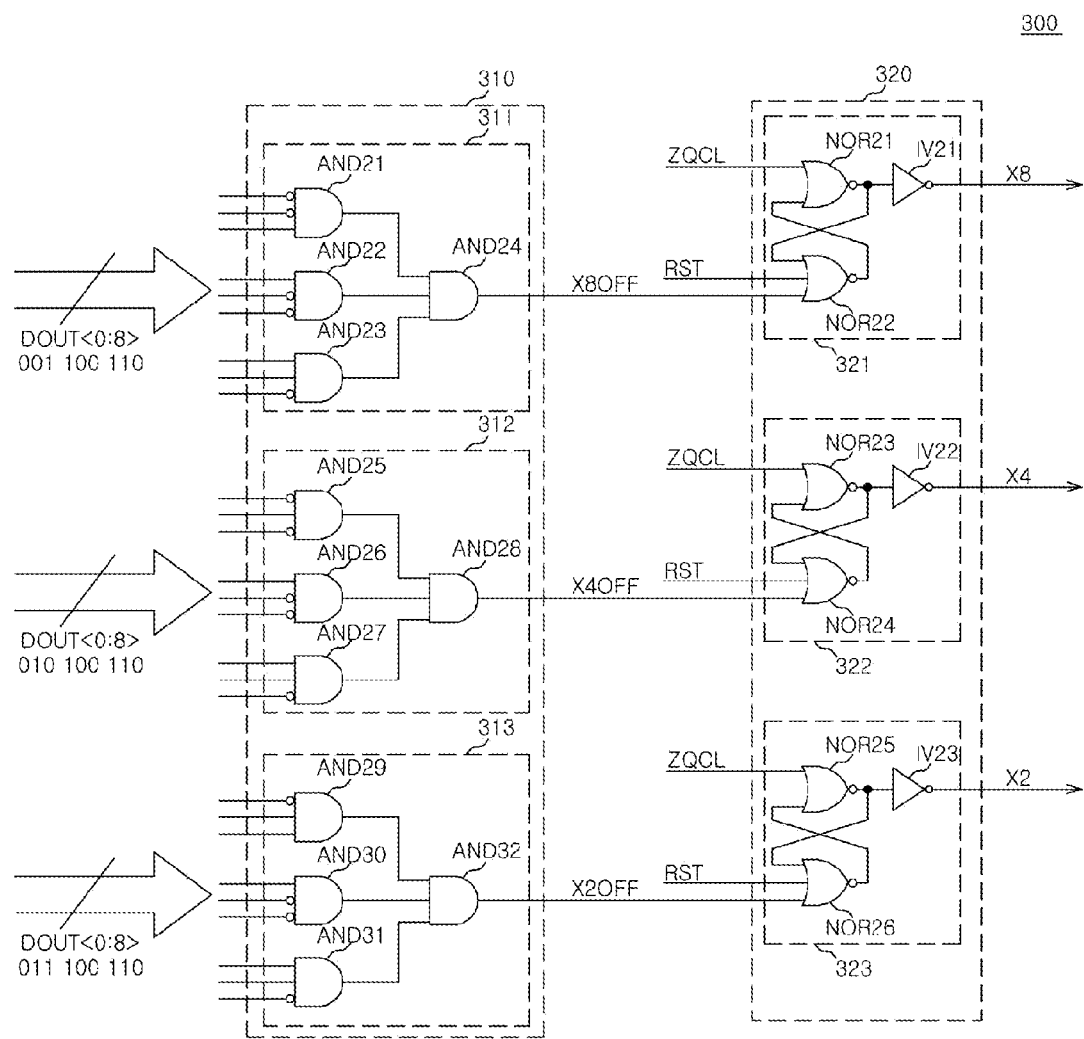
FIG. 6 is a block diagram illustrating the structure of a counting mode signal generator that can be included in the apparatus shown in FIG. 2.

As shown in FIG. 6, the counting mode signal generator 300 can include a counting mode determining unit 310 and a signal generator 320.

The counting mode determining unit 310 can include first to third determining units 311 to 313 that can be configured to use the counting signal 'DOUT<0:8>' to generate a first counting mode end signal 'X80FF', a second counting mode end signal 'X40FF', and a third counting mode end signal 'X20FF', respectively. The first determining unit 311 can include first to fourth AND gates AND21 to AND24. When the counting signal 'DOUT<0:8>' has a first logic value (for example, 001100110), the first determining unit 311 can be configured to activate the first counting mode end signal 'X80FF'.

The second determining unit 312 can include fifth to eighth AND gates AND25 to AND28. When the counting signal 'DOUT<0:8>' has a second logic value (for example, 010100110), the second determining unit 312 can be configured to activate the second counting mode end signal 'X40FF'.

The third determining unit 313 can include ninth to twelfth AND gates AND29 to AND32. When the counting signal 'DOUT<0:8>' has a third logic value (for example, 011100110), the third determining unit 313 can be configured to activate the third counting mode end signal 'X20FF'.

The first to twelfth AND gates AND21 to AND32 can each have three input terminals, and one or more input terminals of the three input terminal can be formed of inverted input terminals corresponding to the first to third logic values.

The signal generator 320 can include first to third signal generators 321 and 323 that can be configured to activate or deactivate the first to third counting mode signals 'X8', 'X4', and 'X2' according to the first to third counting mode end signals 'X80FF', 'X40FF', and 'X20FF' and the adjustment start signal 'ZQCL'.

The first signal generator 321 can be configured to activate the first counting mode signal 'X8' in response to the activation of the adjustment start signal 'ZQCL', and deactivate the first counting mode signal 'X8' in response to the activation of the first counting mode end signal 'X80FF'. The first signal generator 321 can include a latch circuit having first and second NOR gates NOR21 and NOR22 that can be configured to receive the adjustment start signal 'ZQCL' and the first counting mode end signal 'X80FF', respectively. The first signal generator 321 can further include an inverter IV21 for inverting the phase of the first counting mode signal 'X8' to match a subsequent circuit.

The second signal generator 322 can be configured to activate the second counting mode signal 'X4' in response to the activation of the adjustment start signal 'ZQCL', and deactivate the second counting mode signal 'X4' in response to the activation of the second counting mode end signal 'X40FF'. The second signal generator 322 can include a latch circuit having third and fourth NOR gates NOR23 and NOR24 that receive the adjustment start signal 'ZQCL' and the second counting mode end signal 'X40FF', respectively. The second signal generator 322 can further include an inverter IV22 inverting the phase of the second counting mode signal 'X4' to match a subsequent circuit.

The third signal generator 323 can be configured to activate the third counting mode signal 'X2' in response to the activation of the adjustment start signal 'ZQCL', and deactivate the third counting mode signal 'X2' in response to the activation of the third counting mode end signal 'X20FF'. The third signal generator 323 can include a latch circuit having fifth and sixth NOR gates NOR25 and NOR26 that receive the adjustment start signal 'ZQCL' and the third counting mode end signal 'X20FF', respectively. The third signal generator 323 can further include an inverter IV23 inverting the phase of the third counting mode signal 'X2' to match a subsequent circuit.

Figure 7:
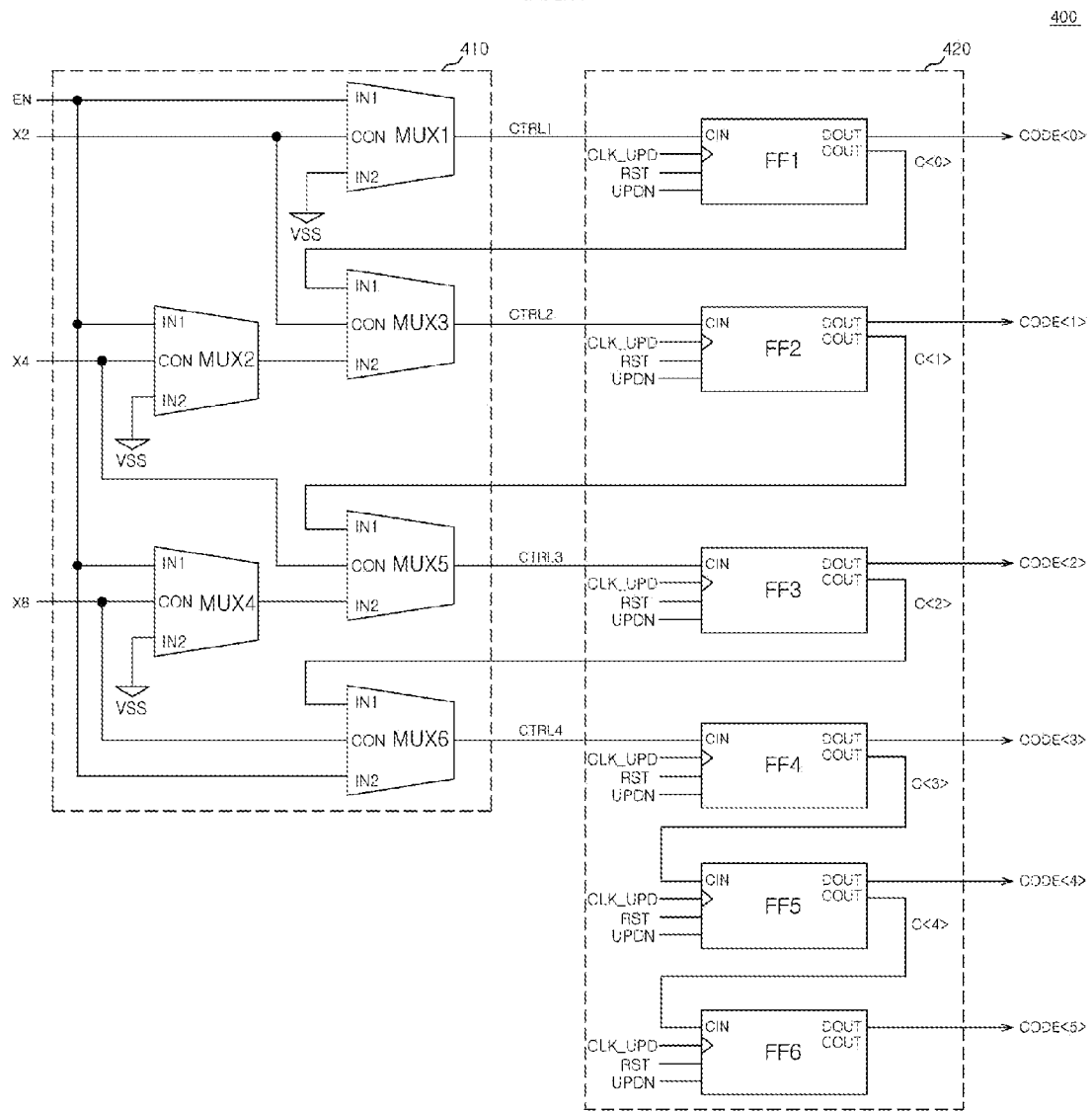
FIG. 7 is a circuit diagram illustrating a multi-mode counter that can be included in the apparatus shown in FIG. 2.

As shown in FIG. 7, the multi-mode counter 400 can include a counting controller 410 and a 6-bit counter 420.

The counting controller 410 can be configured to generate first to fourth control signals 'CTRL1' to 'CTRL4' for controlling the counting mode of the 6-bit counter 420 in response to the basic counting signal 'EN' and the first to third counting mode signals 'X8', 'X4', and 'X2'. The counting controller 410 can include first to sixth multiplexers MUX1 to MUX6.

The first multiplexer MUX1 can have a first input terminal IN1 to which the basic counting signal 'EN' is input, a second input terminal IN2 connected to the ground, and a control terminal CON to which the third counting mode signal 'X2' is input.

The second multiplexer MUX2 can have a first input terminal IN1 to which the basic counting signal 'EN' is input, a second input terminal IN2 connected to the ground, and a control terminal CON to which the second counting mode signal 'X4' is input.

The third multiplexer MUX3 can have a first input terminal IN1 to which a carry 0 signal ('C<0>') is input, a second input terminal IN2 to which an output signal of the second multiplexer MUX2 is input, and a control terminal CON to which the third counting mode signal 'X2' is input.

The fourth multiplexer MUX4 can have a first input terminal IN1 to which the basic counting signal 'EN' is input, a second input terminal IN2 connected to the ground, and a control terminal CON to which the first counting mode signal 'X8' is input.

The fifth multiplexer MUX5 can have a first input terminal IN1 to which a carry signal ('C<1>') is input, a second input terminal IN2 to which an output signal of the fourth multiplexer MUX4 is input, and a control terminal CON to which the second counting mode signal 'X4' is input.

The sixth multiplexer MUX6 can have a first input terminal IN1 to which a carry 2 ('C<2>') is input, a second input terminal IN2 to which the basic counting signal 'EN' is input, and a control terminal CON to which the first counting mode signal 'X8' is input.

Each of the first to sixth multiplexers MUX1 to MUX6 can be configured to output the signal input through the first input terminal IN1 or the second input terminal IN2 according to the level of the signal input to the control terminal CON thereof. For example, when a high-level signal is input to the control terminal CON, each of the first to sixth multiplexers MUX1 to MUX6 can be configured to output the signal input through the second input terminal IN2.

The 6-bit counter 420 can include first to sixth flip-flops FF1 to FF6. Each of the first to fourth flip-flops FF1 to FF4 can be configured to receive any one of the first to fourth control signals 'CTRL1' to 'CTRL4' in response to the update clock signal 'CLK_UPD' and the reset signal 'RST', and count up or down the received signal according to the count up/down signal 'UPDN'. Then, each of the first to fourth flip-flops FF1 to FF4 can be configured to output the counting result as a code signal 'CODE<0:3>' and a carry signal ('C<0:3>').

The fifth flip-flop FF5 can be configured to receive the carry signal ('C<3>') in response to the update clock signal 'CLK_UPD' and the reset signal 'RST', and count up or down the received signal according to the count up/down signal 'UPDN'. Then, the fifth flip-flop FF5 can be configured to output the counting result as a code signal 'CODE<4>' and a carry signal ('C<4>'). The sixth flip-flop FF6 can be configured to receive the carry signal ('C<4>') in response to the update clock signal 'CLK_UPD' and the reset signal 'RST', and count up or down the received signal according to the count up/down signal 'UPDN'. Then, the sixth flip-flop FF6 can be configured to output the counting result as a code signal 'CODE<5>'.

Next, the operation of the apparatus 101 for adjusting the resistance value of a driver of a semiconductor integrated circuit having the above-mentioned structure will be described.

In this example, it can be assumed that a comparison process is performed eight times total in a 64 clock period of 512 clocks, and the update of the code signals 'CODE<0:5>', that is, the adjustment of the resistance value is performed seven times.

A process of adjusting the resistance value of a driver can start with the activation of the adjustment enable signal 'ZQCAL_EN' after a predetermined time has elapsed from the activation of the adjustment start signal 'ZQCL'.

The 9-bit counter 220 shown in FIG. 3 counts the clock signal 'CLK' when the adjustment start signal 'ZQCL' is activated, and outputs the counting signal 'DOUT<0:8>'.

The basic counting signal generator 240 shown in FIG. 4 detects an initial value 000000000 of the counting signal 'DOUT<0:8>', and activates the activation start signal 'START'. When the activation start signal 'START' is activated, the basic counting signal 'EN' is activated through the signal driving unit 243 and the latch unit 244. The basic counting signal 'EN' is kept in an active state until the activation end signal 'END' is activated.

The update clock generator 250 shown in FIG. 5 generates the update clock signal 'CLK_UPD' in a 64 clock ('CLK') period, and outputs the clock signal 'CLK_UPD'. The update clock generator 250 determines whether low-order six bits having a specific value (for example, 111010) of the counting signal 'DOUT<0:8>' are repeated in order to generate the update clock signal 'CLK_UPD' in a 64 clock period. Whenever the low-order six bits of the counting signal 'DOUT<0:8>' have the specific value (111010), the update clock generator 250 generates the update clock signal 'CLK_UPD' and outputs the signal. The specific value (111010), that is, the low-order six bits of the counting signal 'DOUT<0:8>' are set to ensure a signal processing margin, and it can be changed according to the requirements of a particular implementation.

The buffer 210 shown in FIG. 3 buffers the comparison result signal 'CMPOUT', and outputs the signal as the count up/down signal 'UPDN'.

The signal generator 320 shown in FIG. 6 activates the first to third counting mode signals 'X8', 'X4', and 'X2' when the adjustment start signal 'ZQCL' is activated.

The counting mode determining unit 310 shown in FIG. 6 sequentially activates the first to third counting mode end signals 'X80FF', 'X40FF', and 'X20FF' whenever the count of the counting signal 'DOUT<0:8>' reaches 64 clocks 'CLK'. The low-order six bits of each of the logic values 001100110, 010100110, and 011100110 that count 64 clocks are set to ensure a signal processing margin, and it can be changed according to the requirements of a particular implementation.

When the first to third counting mode end signals 'X80FF', 'X40FF', and 'X20FF' are activated, the first to third counting mode signals 'X8', 'X4', and 'X2' corresponding thereto are deactivated.

When the adjustment start signal 'ZQCL' is activated, the first to third counting mode signals 'X8', 'X4', and 'X2' are activated. The basic counting signal 'EN' is kept in an active state during 512 clocks 'CLK'.

When the 9-bit counter 220 shown in FIG. 3 counts the counting signal 'DOUT<0:8>' and the counting signal 'DOUT<0:8>' reaches a value corresponding to the sixty-fourth clock 'CLK', the first counting mode end signal 'X80FF' is activated.

When the first counting mode end signal 'X80FF' is activated, the first counting mode signal 'X8' is inactivated, and the second and third counting mode signals 'X4' and 'X2' and the basic counting signal 'EN' are maintained in an active state.

When the counting signal 'DOUT<0:8>' reaches a value corresponding to the next sixty-fourth clock 'CLK', the second counting mode end signal 'X40FF' is activated.

When the second counting mode end signal 'X40FF' is activated, the first counting mode signal 'X8' and the second counting mode signal 'X4' are deactivated, and the third counting mode signal 'X2' and the basic counting signal 'EN' are maintained in an active state.

When the counting signal 'DOUT<0:8>' reaches a value corresponding to the next sixty-fourth clock 'CLK', the third counting mode end signal 'X20FF' is activated.

When the third counting mode end signal 'X20FF' is activated, the first to third counting mode signals 'X8', 'X4', and 'X2' are all deactivated, and the basic counting signal 'EN' are maintained in an active state until the counting signal 'DOUT<0:8>' reaches a value corresponding to a 512nd clock 'CLK'.

The multi-mode counter 400 shown in FIG. 7 counts the code signal 'CODE<0:5>' in different counting units according to the first to third counting mode signals 'X8', 'X4', and 'X2' and the basic counting signal 'EN'.

When the basic counting signal 'EN' and the first to third counting mode signals 'X8', 'X4', and 'X2' are all activated, the multi-mode counter 400 operates in a counting mode in which counting is performed in the unit of 8. Since the basic counting signal 'EN' and the first to third counting mode signals 'X8', 'X4', and 'X2' are all activated, the first to third control signals 'CTRL1' to 'CTRL3' are deactivated at low levels, and the fourth control signal 'CTRL4' is activated at a high level. Since signals at the ground level are input to the carry input terminals CIN of the first to third flip-flops FF1 to FF3, the first to third flip-flops FF1 to FF3 do not change the values of the code signals CODE<0:2>. In addition, the carry 0 to 2 signals ('C<0>' to 'C<2>') are not generated. The fourth flip-flop FF4 changes the value of the code signal 'CODE<3:5>' in response to the update clock signal 'CLK_UPD' using the activated fourth control signal 'CTRL4' as a carry input. The fifth and sixth flip-flops FF5 and FF6 are operated when the fourth flip-flop FF4 is operated, regardless of the first to fourth control signals 'CTRL1' to 'CTRL4'. Since the code signals 'CODE<0:2>' are not changed but the code signals 'CODE<3:5>' are changed, counting is performed in the unit of 8.

When the basic counting signal 'EN' and the second and third counting mode signals 'X4' and 'X2' are all activated, the multi-mode counter 400 is operated in a mode in which counting is performed in the unit of 4. Since the basic counting signal 'EN' and the second and third counting mode signals 'X4' and 'X2' are all activated, the first and second control signals 'CTRL1' and 'CTRL2' are deactivated at low levels, and the third and fourth control signals 'CTRL3' and 'CTRL4' are activated at high levels. The first and second flip-flops FF1 and FF2 do not change the values of the code signals 'CODE<0:1>' since signals at the ground levels are input to the carry input terminals CIN thereof. In addition, the carry 0 and 1 signals ('C<0>' and 'C<1>') are not generated. The third and fourth flip-flops FF3 and FF4 are operated when the third and fourth control signals 'CTRL3' and 'CTRL4' that are activated or deactivated according to whether a carry is generated in the previous flip-flop are input to the carry input terminals CIN thereof. The fifth and sixth flip-flops FF5 and FF6 are operated when the fourth flip-flop FF4 is operated, regardless of the first to fourth control signals 'CTRL1' to 'CTRL4'. Since the code signals 'CODE<0:1>' are not changed, but the code signals 'CODE<2:5>' are changed, counting is performed in the unit of 4.

When the basic counting signal 'EN' and the third counting mode signals 'X2' are all activated, the multi-mode counter 400 is operated in a counting mode in which counting is performed in the unit of 2. Since the basic counting signal 'EN' and the third counting mode signal 'X2' are all activated, the first control signal 'CTRL1' is deactivated at a low level, and the second control signal 'CTRL2' is activated at a high level. The first flip-flop FF1 does not change the value of the code signal 'CODE<0>' since a signal at the ground level is input to the carry input terminal CIN thereof. In addition, the carry 0 signal ('C<0>') is not generated. The second flip-flop FF2 is operated since the second control signal 'CTRL2' is activated. The third and fourth flip-flops FF3 and FF4 are operated when the third and fourth control signals 'CTRL3' and 'CTRL4' that are activated or deactivated according to whether a carry is generated in the previous flip-flop are input to the carry input terminals CIN thereof. The fifth and sixth flip-flops FF5 and FF6 are operated when the fourth flip-flop FF4 is operated, regardless of the first to fourth control signals 'CTRL1' to 'CTRL4'. Since the code signal 'CODE<0>' is not changed, but the code signals 'CODE<1:5>' are changed, counting is performed in the unit of 2.

When only the basic counting signal 'EN' is activated, the multi-mode counter 400 is operated in a counting mode in which counting is performed in the unit of 1. Since only the basic counting signal 'EN' is activated, the first control signal 'CTRL1' is activated at a high level. The 6-bit counter 420 operates as a general counter. The second to fourth flip-flops FF2 to FF4 are operated when the second to fourth control signals 'CTRL2' to 'CTRL4' that are activated or deactivated according to whether a carry is generated in the previous flip-flop are input to the carry input terminals CIN thereof. The fifth and sixth flip-flops FF5 and FF6 are operated when the fourth flip-flop FF4 is operated, regardless of the first to fourth control signals 'CTRL1' to 'CTRL4'. Since the code signals 'CODE<0:5>' are all changed, counting is performed in the unit of 1.

Figure 8:
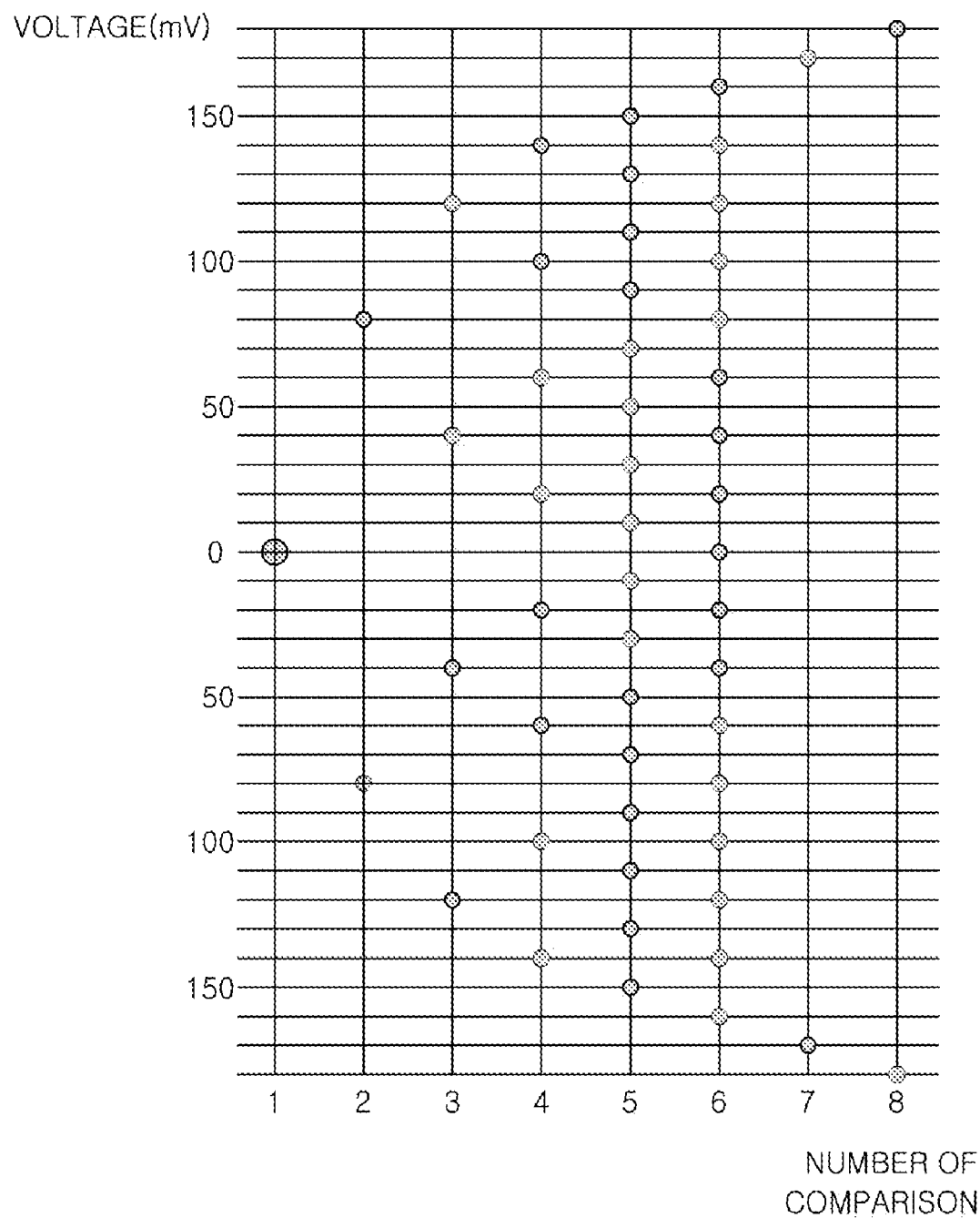
FIG. 8 is a graph illustrating a method of adjusting the resistance value of a driver of a semiconductor integrated circuit using the apparatus of FIG. 2.

In this example, as shown in FIG. 8, the multi-mode counter 400 sequentially operates in the 8-unit counting mode, the 4-unit counting mode, the 2-unit counting mode, and four times of the 1-unit counting mode in a 64 clock ('CLK') period of 512 clocks 'CLK', thereby updating the code signals 'CODE<0:5>'.

In order to change the counting unit, the counting mode signal generator 300 can be configured such that the first to third counting mode signals 'X8', 'X4', and 'X2' are all activated in an initial state and then sequentially inactivated.

When the code signals 'CODE<0:5>' are updated, the resistance value of the digital-to-analog converter 500 can be changed, and the level of the analog feedback voltage VFB can be changed.

The comparator 100 shown in FIG. 2 can be configured to compare the reference voltage VREF with the analog feedback voltage VFB and output the comparison result signal 'CMPOUT'.

The controller 200 can be configured to repeat a process of outputting the count up/down signal 'UPDN' according to the comparison result signal 'CMPOUT' to increase or decrease the values of the code signals 'CODE<0:5>' during 512 clocks 'CLK', thereby adjusting the resistance value.

According to the above-described embodiments, an apparatus for adjusting the resistance value of a driver of a semiconductor integrated circuit can be configured so as to change the counting unit, that is, resolution, and use a method of sequentially increasing the resolution. Therefore, the apparatus can considerably widen an adjustable range of the resistance value and quickly adjust the resistance value to a desired value.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An apparatus for adjusting a resistance value of a driver of a semiconductor integrated circuit in which the resistance value of the driver is adjusted according to a code signal, the apparatus comprising:
    a control means that generates a plurality of counting mode signals such that a unit of counting is changed in a predetermined period;
    a counting means that counts the code signal in the unit of counting that is changed in response to the plurality of counting mode signals, according to a count up/down signal; and
    a comparing means that compares a voltage obtained by converting the code signal with a reference voltage to generate the count up/down signal,
    wherein the control means generates the plurality of counting mode signals such that the counting unit performs 8-unit counting, 4-unit counting, and 2-unit counting during a predetermined period for the overall time required to adjust the resistance value of the driver, and repeats one-unit counting in the other period.

2. The apparatus of claim 1, wherein the control means includes:
    a controller that generates a counting signal and a signal for determining an operation section and an operation period of the counting means in response to an adjustment enable signal; and
    a counting mode signal generator that generates the plurality of counting mode signals using an adjustment start signal and the counting signal.

3. The apparatus of claim 2, wherein the controller includes:
    a counter that counts clocks in response to the adjustment enable signal and outputs the result as the counting signal; and
    a control logic circuit that generates a signal for determining an operation section and an operation period of the counting unit using the counting signal.

4. The apparatus of claim 3, wherein the control logic circuit includes:
    a basic counting signal generator that determines whether the counting signal has a first logic value or a second logic value, and generates a basic counting signal for setting the operation period of the counting signal; and
    an update clock generator that determines whether the counting signal has a third logic value and generates an update clock signal for setting the operation period of the counting signal.

5. The apparatus of claim 4, wherein the basic counting signal generator includes:
    an activation start determining unit that generates an activation start signal for determining to start activating the basic counting signal when the counting signal has the first logic value;
    an activation end determining unit that generates an activation end signal for determining to inactivate the basic counting signal when the counting signal has the second logic value; and
    a signal driving unit that generates the basic counting signal according to the activation start signal and the activation end signal.

6. The apparatus of claim 5, wherein the activation start determining unit includes:
    a plurality of logic elements having output terminals whose levels are activated when the logic value of the counting signal is equal to the first value.

7. The apparatus of claim 5, wherein the activation end determining unit includes:
    a plurality of logic elements having output terminals whose levels are activated when the logic value of the counting signal is equal to the second value.

8. The apparatus of claim 5, wherein the signal driving unit is configured such that the level of an output terminal is equal to the level of a power supply voltage in response to the activation start signal and the level of the output terminal is equal to a ground level in response to the activation end signal.

9. The apparatus of claim 5, wherein the basic counting signal generator further includes:
    a latch unit that maintains the level of an output signal of the signal driving unit after the activation start signal is activated until the activation end signal is activated.

10. The apparatus of claim 4, wherein the update clock generator includes a plurality of logic elements having output terminals whose levels are activated when the logic values of some bits of the counting signal are equal to the third logic value.

11. The apparatus of claim 3, wherein the controller further includes:
    a buffer that buffers the result obtained by the comparing means and outputs the result as the count up/down signal.

12. The apparatus of claim 1, wherein the counting means includes:
    a counter that counts the code signals in the unit of counting that is changed according to combinations of a plurality of control signals; and a counting controller that controls the unit of counting performed by the counter in response to the plurality of counting mode signals.

13. The apparatus of claim 12, wherein the counter includes a plurality of flip-flops that operate using the plurality of control signals as carry inputs.

14. The apparatus of claim 13, wherein the counter further includes:
at least one flip-flop that operates in response to the output of one of the flip-flops that outputs the most significant bit, regardless of the plurality of control signals.

15. The apparatus of claim 12, wherein the counter is configured to count the code signals in a one-unit counting mode, a 4-unit counting mode, or an 8-unit counting mode.

16. The apparatus of claim 15, wherein, in the one-unit counting mode of the counter, among the plurality of control signals, a first control signal for controlling the operation of the least significant bit is activated, in the 2-unit counting mode, the first control signal is inactivated, and a second control signal for controlling the operation of the second least significant bit is activated, in the 4-unit counting mode, the first and second control signals are inactivated, and a third control signal for controlling the operation of the third least significant bit is activated, and in the 8-unit counting mode, the first to third control signals are inactivated, and a fourth control signal for controlling the operation of the fourth least significant bit is activated.

17. The apparatus of claim 12, wherein the counting controller includes:
a plurality of multiplexers that receive the plurality of counting mode signals as control signals and output a basic counting signal or a carry output from the counter as the plurality of control signals.

18. The apparatus of claim 17, wherein the counting controller includes:
a first multiplexer that has a first input terminal to which the basic counting signal is input, a second input terminal connected to the ground, and a control terminal to which a third counting mode signal is input, and outputs the first control signal in response to the third counting mode signal;
a second multiplexer that has a first input terminal to which the basic counting signal is input, a second input terminal connected to the ground, and a control terminal to which a second counting mode signal is input, and outputs a signal in response to the second counting mode signal;
a third multiplexer that has a first input terminal to which a carry corresponding to the least significant bit is input, a second input terminal to which the signal output from the second multiplexer is input, and a control terminal to which a third counting mode signal is input, and outputs the second control signal in response to the third counting mode signal;
a fourth multiplexer that has a first input terminal to which the basic counting signal is input, a second input terminal connected to the ground, and a control terminal to which a first counting mode signal is input, and outputs a signal in response to the first counting mode signal;
a fifth multiplexer that has a first input terminal to which a carry corresponding to the second least significant bit is input, a second input terminal to which the signal output from the fourth multiplexer is input, and a control terminal to which the second counting mode signal is input, and outputs the third control signal in response to the second counting mode signal; and
a sixth multiplexer that has a first input terminal to which a carry corresponding to the third least significant bit is input, a second input terminal to which the basic counting signal is input, and a control terminal to which the first counting mode signal is input, and outputs the fourth control signal in response to the first counting mode signal.

19. The apparatus of claim 1, wherein the comparing means includes:
a digital-to-analog converter that converts the code signal into an analog voltage; and
a comparator that compares the analog voltage with a reference voltage and generates the count up/down signal.

20. An apparatus for adjusting a resistance value of a driver of a semiconductor integrated circuit in which the resistance value of the driver is adjusted according to a code signal, the apparatus comprising:
a control means that generates a plurality of counting mode signals such that a unit of counting is changed in a predetermined period;
a counting means that counts the code signal in the unit of counting that is changed in response to the plurality of counting mode signals, according to a count up/down signal; and
a comparing means that compares a voltage obtained by converting the code signal with a reference voltage to generate the count up/down signal,
wherein the control means generates the plurality of counting mode signals such that the counting unit is operated in the 8-unit counting mode, the 4-unit counting mode, the 2-unit counting mode, and the one-unit counting mode in this order.

* * * * *